United States Patent [19]
Lancaster

[11] Patent Number: 6,140,676
[45] Date of Patent: Oct. 31, 2000

[54] SEMICONDUCTOR NON-VOLATILE MEMORY DEVICE HAVING AN IMPROVED WRITE SPEED

[75] Inventor: Loren T. Lancaster, Colorado Springs, Colo.

[73] Assignee: Cypress Semiconductor Corporation, San Jose, Calif.

[21] Appl. No.: 09/082,167

[22] Filed: May 20, 1998

[51] Int. Cl.[7] .............................. H01L 29/78; H01L 33/00
[52] U.S. Cl. .......................................................... 257/315
[58] Field of Search ............................................. 257/315

[56] References Cited

U.S. PATENT DOCUMENTS 4,958,321  9/1990  Chang .
5,297,096  3/1994  Terada et al. .

OTHER PUBLICATIONS

Hu et al., "Charge Retention in Scaled SONOS Nonvolatile Semiconductor Memory Devices—Modeling and Characterization", Solid–State Electronics, vol. 36, No. 10, pp 1401–1416, 1993.

Minami et al., A Novel MONOS Nonvolatile Memory Device Ensuring 10–Year Data Retention after $10^7$ Erase/Write Cycles, IEEE Transactions on Electron Devices, vol. 40, pp. 2011–2017No. 11, Nov. 1993.

Reisinger et al., "A Novel SONOS Structure for Nonvolatile Memories with Improved Data Retention", 1997 Symposium on VLSI Technology Digest of Technical Papers, pp. 113–114.

Ghandi, *VLSI Fabrication Principles*, John Wiley & Sons, 1983, pp. 164–171; 432–441.

*Primary Examiner*—Stephen D. Meier
*Attorney, Agent, or Firm*—Bradley T. Sako

[57] ABSTRACT

A non-volatile memory IGFET device has a gate dielectric stack that is dielectrically equivalent to a layer of silicon dioxide having a thickness of 170 Å or less. Above the dielectric stack is a polycrystalline silicon gate that is doped in an opposite manner to that of the source and drain regions of the transistor. By using a gate doping that is opposite to that of the IGFET source and drain regions, the poly depletion layer that can occur during programming in modern and advanced memory devices is eliminated according to this invention. The device of this invention forms an accumulation layer in the poly rather than a depletion layer. This difference not only greatly improves the program speed, but allows for selecting the gate doping at levels as low as $10^{11}/cm^3$, or less, without significantly compromising the program speed. Further, since the majority of the applied voltage in a device according to this invention is dropped over the gate dielectric, rather than shared between the gate dielectric and a depletion layer in the gate poly, the device of this invention can be scaled in gate dielectric thickness without significantly compromising the program speed.

48 Claims, 13 Drawing Sheets

Even though a Poly Depletion exists, the Bulk Depletion Is converted to a Bulk Accumulation, so Delta_V_Poly + Delta_V_Top_Ox + Delta_V_Storage_Layer + Delta_V_Bottom_Ox = Vpp.

Ideally Delta_V_Poly << Vpp.

When Delta_V_Poly is a small fraction of Vpp, e.g. 0.5 volts out of 10.0 volts, this leaving a healthy Delta_V_Top_Ox + Delta_V_Storage_Layer + Delta_V_Bottom_Ox = 9.5 volts.

The Poly and Bulk Depletions are converted to Accumulation layers, so this is an ideal situation where all of the applied voltage, Vpp, drops across the gate dielectric.

Delta_V_Top_Ox + Delta_V_Storage_Layer + Delta_V_Bottom_Ox = Vpp.

Delta_V_Top_Ox + Delta_V_Storage_Layer + Delta_V_Bottom_Ox + Delta_V_Bulk = Vpp

Delta_V_Top_Ox + Delta_V_Storage_Layer + Delta_V_Bottom_Ox + Delta_V_Bulk = Vpp

SEMICONDUCTOR NON-VOLATILE MEMORY DEVICE HAVING AN IMPROVED WRITE SPEED

BACKGROUND OF THE INVENTION

1. Field of the Invention

This invention relates to improvements in semiconductor non-volatile memory transistors, and more specifically improvements in the gate design and processing of non-volatile transistors used in electrically erasable, electrically programmable read-only memories.

2. Description of the Related Art

Until recently, the gate structure of non-volatile memory transistors has been designed in a similar manner to that of conventional CMOS insulted gate field effect transistors (IGFETs) or MOSFETs. The difference between CMOS IGFETs and non-volatile IGFETs is primarily that non-volatile IGFETs include an added charge storage layer embedded in the gate dielectric. The charge storage layer is either a conductive element, such as a polycrystalline silicon (poly) floating gate, or a non-conductive element such as a dielectric which is capable of trapping charge. Older types of CMOS transistors have typically used a heavily doped N-type gate material for both N- and P-channel transistors in order to simplify processing and to achieve low poly resistivity. With the advent of deep sub-micron CMOS technology, a greater emphasis has been placed on reduced temperature processing, deeply scaled transistor geometries, and silicided polycrystalline silicon gates. This emphasis has led to changes in the gate structure that affect the doping of the poly.

In older technologies, the poly was typically doped by furnace diffusion processes using $POCl_3$ or Phosphine gas to produce a heavily doped N-type material. In newer technologies with channel length geometries at 0.7 microns and below, the furnace diffusion doping processes have been replaced with ion-implantation or low temperature in-situ doping during the poly deposition. These newer doping methods, which allow for substantially reduced thermal processing while doping the poly gate, are necessary to produce deeply scaled transistor geometries. Further, these newer doping methods allow for better doping control in the poly which is useful in facilitating the formation of a metal-silicide layer on top of the poly. Also, in newer technologies, it has been advantageous to use both N- and P-type doped poly, rather than simply N-type poly. Using P-type poly allows deeply scaled P-type MOS transistors to operate more efficiently at lower channel lengths due to the elimination of a buried channel that is usually required with N-type poly. Thus, N-type poly gates are often used in today's N-channel MOSFETs and P-type poly gates are often used in today's advanced P-channel MOSFETs. In these modern devices, the gate doping type is matched to the source and drain junction doping type.

Until recently, there has been no advantage in using different criteria for choosing a gate doping type for non-volatile memory devices from those used to choose the doping type for conventional MOSFETS. The choice has been primarily motivated by a desire to save costs by being compatible with processes used to produce conventional MOSFET devices. As a result, more recently developed doping methods and doping types for conventional MOSFETs have been applied to the construction of non-volatile memory transistors. Specifically, advanced N-channel non-volatile memory transistors are constructed using an N-type poly gate, advanced P-channel transistors are constructed using a P-type poly gate, and doping levels in both are often lower than what was used in the past.

In FIG. 1 memory transistor 10 shows an N-channel non-volatile insulated gate field effect transistor which includes a charge storage layer 32 embedded in its gate dielectric, according to prior art. The charge storage layer 32 is typically surrounded by at least a top dielectric 31 and a bottom dielectric 33 and resides between the N-type gate 12 and the channel 15 of the transistor. Channel 15 resides in the P-type silicon bulk 11 between the N-type source 14 and N-type drain 16 regions. The charge storage layer 32 is either a "floating gate", typically of doped polycrystalline silicon, or a dielectric material capable of trapping charge carriers such as silicon nitride, silicon oxynitride, silicon-rich silicon dioxide, or a ferroelectric material. The thickness of the gate dielectric, the composite of layers 31, 32 and 33, is typically dielectrically equivalent to 150 Å to 200 Å of silicon dioxide, although thinner dielectrics are currently under investigation. Note that transistor 10 could optionally include a silicide layer on top of the N-type gate 12.

In FIG. 2 memory transistor 10' shows a P-channel non-volatile insulated gate field effect transistor which includes a charge storage layer 32 embedded in its gate dielectric, according to prior art. The charge storage layer 32 is typically surrounded by at least a top dielectric 31 and a bottom dielectric 33 and resides between the P-type gate 12' and the channel 15' of the transistor. Channel 15' resides in the N-type silicon bulk 11' between the P-type source 14' and P-type drain 16' regions. The charge storage layer 32 is either a "floating gate", typically of doped polycrystalline silicon, or a dielectric material capable of trapping charge carriers such as silicon nitride, silicon oxynitride, silicon-rich silicon dioxide, or a ferroelectric material. The thickness of the gate dielectric, the composite of layers 31, 32 and 33, is typically dielectrically equivalent to 150 Å to 200 Å of silicon dioxide, although thinner dielectrics are currently under investigation. Note that transistor 10' could optionally include a silicide layer on top of the P-type gate 12'.

The amount and polarity of charge residing in the charge storage layer 32 affect the conductivity of the non-volatile transistor. The words "programmed" and "erased" are used here to describe two possible conductivity states that non-volatile transistors can achieve under two different charge storage conditions. It is recognized that the designation of the words "programmed" and "erased" is purely arbitrary and that these terms can be selected to represent different meanings depending on the application. Here, however, the terms "erased" and "programmed" are used in reference to relative levels of conductance. The terms "erased" or "erase", and "programmed" or "program" are used to describe the "on" and "off" states, respectively. The primary difference between these two states is the level of conductance in non-volatile transistor while under read biases. An "on" state results when the non-volatile transistor is conductive and an "off" state results when the non-volatile transistor is non-conductive, or at least less conductive than a predetermined range of conductance that represents the "on" state. Further, the term "write" is used to describe an operation that intentionally sets the threshold voltage of a non-volatile memory transistor, either to the erase state or to the program state.

Unfortunately, we have discovered that matching the doping type of the gate to that of the source and drain junctions is not-necessarily the optimal choice for building modern non-volatile memory transistor. So effects of using opposite gate and junction doping in non-volatile memory transistors are now being explored. The problem is that the traditional choice can lead to slow program timing and can reduce the scalability of a non-volatile transistor. These problems have not been a factor in devices that have been in production to date. However, as non-volatile device channel length geometries scale to 0.7 micron and below where the effective gate dielectric thickness is 170 Å or less the effects of gate doping become critical to the operation of the non-volatile transistor, as discussed below.

Non-volatile memory transistors oftentimes are written by placing a relatively high voltage on the gate with respect to the transistor channel. For example, a large negative potential (−10 to −20 volts) is placed on gate 12 relative to the channel in order to erase transistor 10 by way of quantum mechanical tunneling. Likewise a large positive potential (+10 to +20 volts) is placed on the gate 12 relative to the channel in order to program transistor 10, again using quantum mechanical tunneling. Similar voltage magnitudes, but opposite polarities, are applied to the gate 12' to erase and program transistor 10'. The large magnitude of the applied voltage is needed in order to both shorten tunneling distances and to lower tunneling barriers. This bias method enables charging the charge storage layer in a reasonable amount of time, typically within hundreds of microseconds to seconds.

The tunneling charge transport in transistors 10 and 10' is described by way of equations known in the industry as Fowler-Nordheim Tunneling, Modified Fowler-Nordheim Tunneling, Direct Tunneling and Trap-Assisted Tunneling. These equations accurately predict that the rate of tunneling charge transport, or tunneling current, into Charge Storage Layer 32 is an exponential function of the electric field across the dielectric through which it is tunneling. The tunnel current that primarily affects write speed is the tunnel current through dielectric 33. So the time it takes to either erase or program a transistor 10 or 10' is a very strong function of the electric field imposed on dielectric layer 33 during a write operation, either erase or program.

Additionally, the electric field created by the gate voltage terminates in the channel region of the bulk and in the poly. When the field terminates in the poly, it does so by either forming an accumulated layer of free charge carriers or by forming a depletion layer at the interface between the poly and the top of the gate dielectric. When the free carriers are accumulated, the poly acts nearly like a metallic electrode and very little voltage is dropped within the poly. However, when the free carriers in the poly are repelled from the interface to form a depletion layer, a significant amount of voltage can be dropped in the poly depletion layer.

As shown in FIG. 3, a positive bias is applied to the poly gate 12 relative to the channel 15 to program transistor 10. In this example, ten volts is applied to gate 12 while the source, drain and bulk are held at ground. The voltage difference between the gate 12 and the bulk 11 creates an electric field that passes through layers 31, 32 and 33 and creates a depletion layer 20 in the gate poly and a depletion layer 21 to form the channel 15 in the bulk. The applied gate-to-bulk voltage creates depletion layer 20 because the electric field attracts the free electrons in the N-type poly gate 12 toward the electrode and away from the interface between the gate 12 and the top dielectric 31. Likewise, the electric field created by the gate-to-bulk bias repels the free holes from interface between the P-type bulk and the bottom dielectric 33, forming bulk depletion 21.

The voltage difference between the gate electrode and the bulk electrode is called Vpp. Vpp is nearly equal to the sum of the voltages dropped across 20, 31, 32, 33, and 21; namely $$Vpp \approx Delta\_V\_Poly + Delta\_V\_Top\_Ox + Delta\_V\_Storage\_Layer + Delta\_V\_Bottom\_Ox + Delta\_V\_Bulk.$$

Unfortunately, the voltage drop in the poly, Delta_V_Poly, provides no value in forming the conditions required to tunnel charge through the dielectric layer 33. In fact, when the depletion layer is present, the tunnel characteristics are much like what would be expected if the device were formed with a metallic gate electrode and the write voltage was lower by the amount dropped in the poly depletion. Since the tunnel current is an exponential function of the electric field across the dielectric, the write speed can be significantly degraded by the poly depletion voltage loss.

The circumstances are quite different when transistor 10 is being erased as shown in FIG. 4. When a negative bias is applied to the N-type poly gate 12 relative to the channel 15 of the N-channel transistor 10, the electric field serves to accumulate the free carriers 24 (electrons) in the poly 12 at the interface between the poly 12 and the top dielectric 31. In this case, there is typically negligible electric field lost in the poly and the erase speed is not degraded by voltage lost in the poly. Further, independent of the gate structure, the erase bias serves to accumulate holes in the channel at the interface between the bulk and the bottom dielectric 33, forming accumulation 23. As a result, negligible voltage is typically dropped in the bulk and so the erase condition creates the ideal result of the Vpp being dropped only over layers 31, 32 and 33; namely $$Vpp = Delta\_V\_Top\_Ox + Delta\_V\_Storage\_Layer + Delta\_V\_Bottom\_Ox.$$

Under good program conditions, as best seen in FIG. 3, little or no voltage is dropped in the N-type poly gate 12. Preferably the voltage drop in the gate, Delta_V_Poly, will be much less than the write voltage, Vpp, applied to the gate. This was readily achieved in older technologies when the doping in the poly gate 12 was high, typically $\geq 10^{20}/cm^3$, and the layers 31, 32 and 33 were relatively thick, equivalently $\geq 170$ Å of $SiO_2$. However, in more modern technologies which use a moderately or lightly doped poly gate 12 and which have relatively thin layers 31, 32 and 33, the voltage drop in the poly depletion layer 20 can be quite substantial, as shown in FIG. 5. In this case, there can be a significant amount of the applied voltage lost in the poly and the time required to program transistor 10 can be greatly increased.

The voltage lost in the poly depletion layer during a program operation has been calculated as shown in FIG. 6 for an applied voltage of 10 volts. In this plot, the percent of the applied voltage dropped in the poly is indicated on the vertical axis. The horizontal axis on the right hand side marks the doping concentration in the poly. The horizontal axis on the left hand side indicates the thickness of the gate dielectric in values equivalent to a thickness of $SiO_2$. The shaded bands in the contour shows domains where the percentage of applied voltage dropped in the poly lies within a 5% range. Six bands of applied voltage drop in the poly are shown; specifically 0 to 5%, 5% to 10%, 10% to 15%, 15% to 20%, 20% to 25% and 25% to 30%.

As shown in FIG. 6, the percentage of applied voltage that is dropped in the poly increases rapidly as the doping concentration falls below $10^{20}/cm^3$. Once the concentration reaches $10^{18}/cm^3$, the percentage of applied voltage that is dropped in the poly achieves about 20%. With further reductions in doping concentration below $10^{18}/cm^3$, the percentage of applied voltage that is dropped in the poly increases only gradually. This lack of sensitivity occurs because of the formation of an inversion layer in the poly in the lower concentrations.

The exponential dependence of tunneling current on linear changes in electric field causes the program time to increase by about an order of magnitude for every 10% decrease in voltage across the gate dielectric. The percentage of applied voltage that is dropped in the poly is less than 10% for thicknesses as low as 57 Å of equivalent gate dielectric when the poly doping concentration is $10^{20}$/cm$^3$ or higher. However, the percentage voltage drop exceeds 10% for a poly doping concentration of $10^{19}$/cm$^3$ when the gate dielectric thickness falls below only 170 Å. This result greatly limits the range of either the poly doping or the equivalent gate dielectric thickness if program speeds cannot be compromised, which is often the case.

Likewise, when a positive bias is applied to the P-type poly gate 12' of P-channel transistor 10' relative to channel 15', the electric field serves to accumulate the free carriers (holes) in the poly 12' at the interface between the poly 12' and the top dielectric 31. In this case, which is an erase condition, there is very little electric field lost in the poly and the erase speed is not degraded by voltage dropped in the poly. However, when a negative bias is applied to the poly gate 12' relative to the channel 15', the electric field serves to repel the free carriers in the poly 12' from the interface and a depletion layer forms in the poly 12' above the top dielectric 31. In this case, which is a program condition, there can be a significant amount of the applied voltage lost in the poly in modern structures and the time required to program transistor 10' can be greatly increased.

While writing a non-volatile memory transistor, it is desirable to achieve the fastest possible program time without compromising product yield and reliability. The program time directly affects the rate at which data can be stored in a non-volatile memory product. Erase speed is not so critical because data is being erased, not stored. Sections of the memory product can be erased in a background manner, long before those sections are selected to store data. Unfortunately, prior art embodiments are constructed to favor fast erase speeds and not fast program speeds as effective gate dielectrics scale to thicknesses of 170 Å and below.

Further, voltage drops in the poly significantly reduce the sensitivity of the write speed to variations in the thicknesses of dielectric layers 31, 32 and 33. This is advantageous in establishing insensitivity to manufacturing induced thickness variations. However, this lack of sensitivity also makes it difficult to scale the program voltage of transistors 10 and 10'. As the layers 31, 32, and 33 are reduced in thickness, the fraction of the applied voltage that is dropped in the poly depletion increases. Eventually, reductions in the thickness of layers 31, 32 and 33 has a diminishing impact on reducing the program voltage. This can occur once the layers 31, 32 and 33 produce a gate dielectric that is dielectrically equivalent in thickness to 170 Å or less of silicon dioxide. Thus, the non-volatile transistor becomes difficult to scale to take advantage of lower program voltages for deeply scaled technologies. Also, the lack of sensitivity to variation in the thickness of layers 31, 32 and 33 is replaced by a sensitivity to variations in doping in the poly, which is traditionally less controllable.

So without further innovation, deeply scaled non-volatile transistors for 0.7 micron technologies and below that have effective gate dielectrics thicknesses of 170 Å and below will provide faster erase speed, rather than faster program speed. Further, the scalability of program voltages by using conventional dielectric scaling methods is limited, making it difficult to integrate into a low-voltage CMOS process flow as device geometries reduce to below 0.7 microns.

SUMMARY OF THE INVENTION

In light of the above, therefore, it is an object of the invention to provide an improved non-volatile semiconductor memory device that provides better program write speed performance compared to prior art devices.

Another object of the invention is to provide an improved non-volatile semiconductor memory device that can be scaled to program using lower voltages without loss in program speed.

Yet another object of the invention is to provide an improved non-volatile semiconductor memory device that exhibits program speeds that are insensitive to variations in the doping level in the gate.

Still another object of the invention is to provide an improved non-volatile semiconductor memory device that scales to technology geometries of 0.7 microns and below without compromising program speeds.

A further object of the invention is to provide an improved non-volatile semiconductor memory device that utilizes a gate dielectric thickness that is dielectrically equivalent to 170 Å of SiO$_2$ or less without loss in program speed.

Yet a further object of the invention is to provide an improved non-volatile semiconductor memory device that can be constructed with a wide range of gate doping concentrations without significant loss in program speed.

The above and further objects, details and advantages of the invention will become apparent from the following detailed description, when read in conjunction with the accompanying drawings and appended claims.

According to the present invention, there is provided a non-volatile memory IGFET device that uses a gate dielectric stack that is dielectrically equivalent in thickness to 170 Å or less of silicon dioxide. Above the dielectric stack is a polycrystalline silicon gate that is doped in an opposite manner to that of the source and drain junctions of the transistor. By using a gate doping that is opposite to that of the IGFET source and drain junctions, the poly depletion layer that can occur during programming in modern and advanced memory devices is eliminated according to this invention. The device of this invention forms an accumulation layer in the poly rather than a depletion layer. This difference not only greatly improves the program speed, but allows for selecting the gate doping at levels as low as $10^{11}$/cm$^3$, or less, without significantly compromising the program speed. Further, since the majority of the applied voltage in a device according to this invention is dropped over the gate dielectric, rather than shared between the gate dielectric and a depletion layer in the gate poly, the device of this invention can be scaled in gate dielectric thickness without significantly compromising the program speed.

BRIEF DESCRIPTION OF THE DRAWINGS

In the detailed description of preferred embodiments of the invention presented below and in the description of prior art above, reference is made to the accompanying drawings of which.

DETAILED DESCRIPTION OF THE PREFERRED EMBODIMENTS

Figure 7:
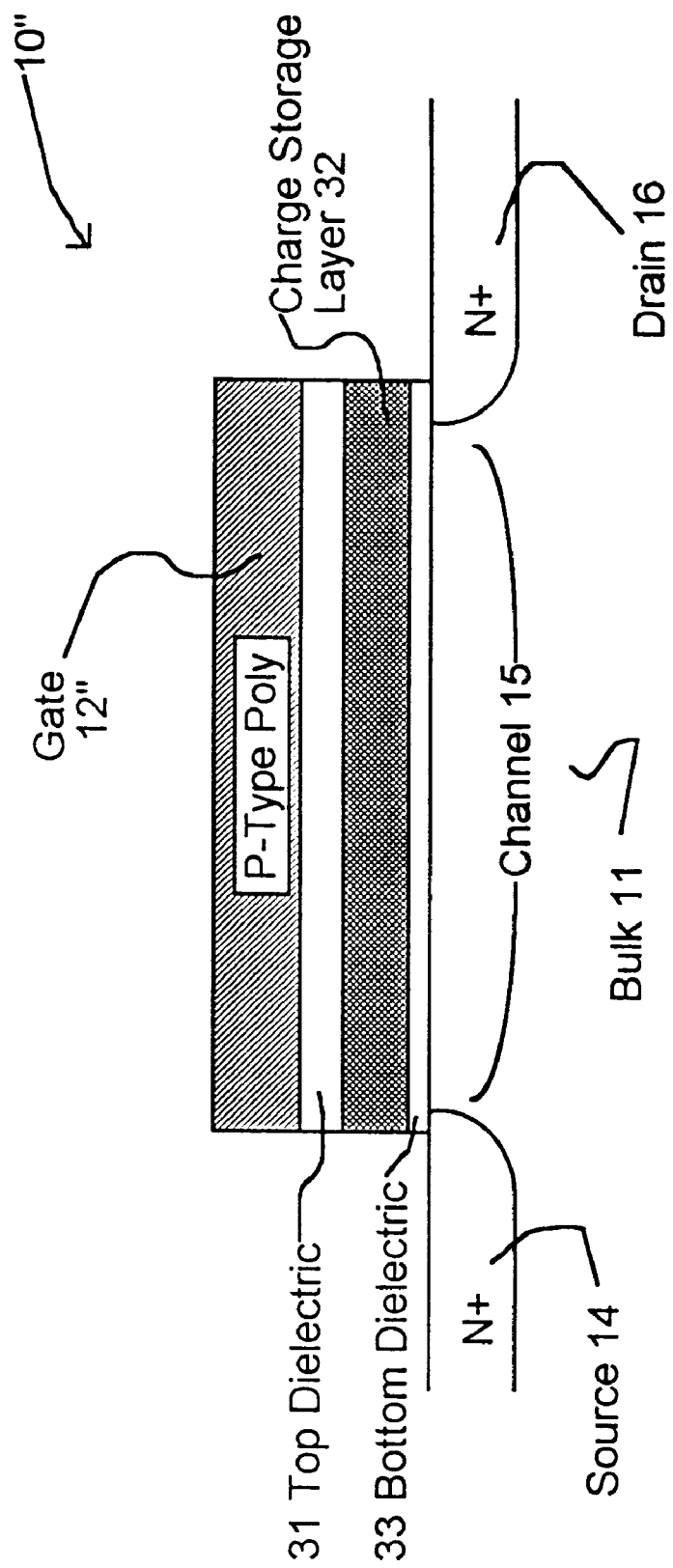
FIG. 7 shows a cross sectional view of an N-channel non-volatile memory transistor according a preferred embodiment of the invention that utilizes a P-type polycrystalline silicon gate.

According to a preferred embodiment of the invention, a non-volatile memory transistor device is provided that uses a gate dielectric stack that is dielectrically equivalent in thickness to 170 Å or less of silicon dioxide. Above the dielectric stack is a polycrystalline silicon gate that is doped to a type that is different from that of the source and drain junctions of an N-channel transistor. As seen in FIG. 7, a P-type poly gate 12" is used in an N-channel non-volatile transistor device 10". The P-type poly gate 12" is doped with electrically active atoms of boron at a concentration of as little as $10^{11}/cm^3$ or less. Memory transistor 10" comprises a non-volatile insulated gate field effect transistor which includes a charge storage layer 32 embedded in its gate dielectric. The charge storage layer 32 is typically separated from the bulk (or substrate) 11 by at least a bottom dielectric 33. Memory transistor 10" optionally includes a top dielectric 31 between the gate 12" and charge storage layer 32. The stack of layers 31, 32 and 33, which comprise the gate dielectric of transistor 10", resides between the P-type gate 12" and the channel 15 of the transistor. Channel 15 resides in the P-type silicon bulk (or substrate) 11 between the N-type source 14 and N-type drain 16 regions.

The charge storage layer 32 is either a "floating gate", typically of polycrystalline silicon, or a dielectric material capable of trapping charge carriers or charge polarization such as silicon nitride, silicon oxynitride, silicon-rich silicon dioxide, or a ferroelectric material. Bottom dielectric layer 33 is typically a thermally grown layer of silicon dioxide, but can be formed using any suitable materials that exhibit dielectric properties. Optional top dielectric layer 31 is typically a grown or deposited layer of silicon dioxide, however, it could be constructed by providing multiple layers of dielectric material, such as a three layer stack of silicon dioxide, silicon nitride and silicon dioxide, or other suitable technique.

Optionally, transistor 10" could include a refractory silicide layer on top of the P-type gate 12'". Further, transistor 10" could optionally be constructed in a P-well formed in the bulk 11 or in a P-well nested inside an N-well, both formed in bulk 11. In the cases, the bulk doping could be either N-type or P-type.

Figure 8:
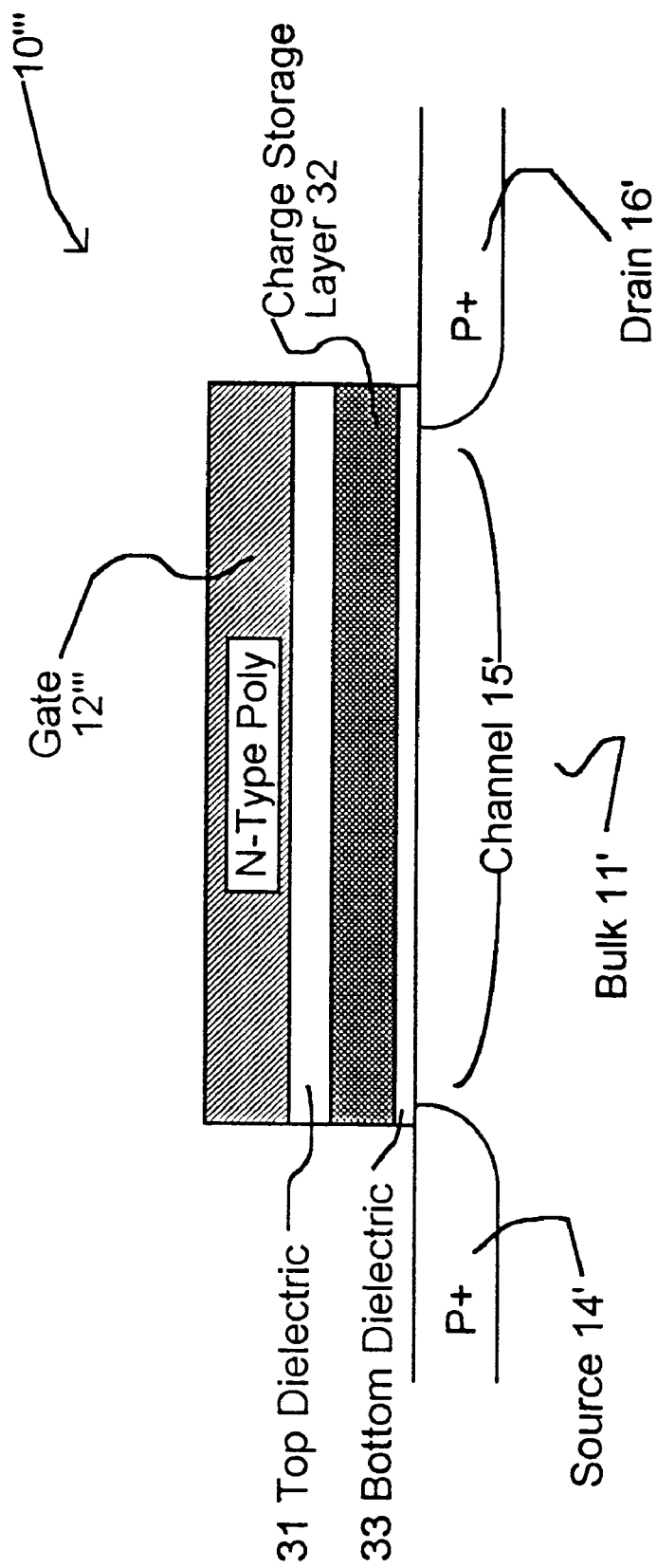
FIG. 8 shows a cross sectional view of a P-channel non-volatile memory transistor according a preferred embodiment of the invention that utilizes an N-type polycrystalline silicon gate.

According to another preferred embodiment of the invention, a non-volatile memory transistor device is provided that uses a gate dielectric stack that is dielectrically equivalent in thickness to 170 Å or less of silicon dioxide. Above the dielectric stack is a polycrystalline silicon gate that is doped to a type that is different from that of the source and drain junctions of a P-channel transistor. As seen in FIG. 8, an N-type poly gate 12'" is used in a P-channel non-volatile transistor device 10'". The N-type poly gate 12'" is doped with electrically active atoms of phosphorus, antimony or arsenic at a concentration of as little as $10^{11}/cm^3$ or less. Memory transistor 10'" comprises a non-volatile insulated gate field effect transistor which includes a charge storage layer 32 embedded in its gate dielectric. The charge storage layer 32 is typically separated from the bulk (or substrate) 11' by at least a bottom dielectric 33. Memory transistor 10'" optionally includes a top dielectric 31 between the gate 12'" and charge storage layer 32. The stack of layers 31, 32 and 33, which comprise the gate dielectric of transistor 10'", resides between the N-type gate 12'" and the channel 15' of the transistor. Channel 15' resides in the N-type silicon bulk (or substrate) 11' between the P-type source 14' and P-type drain 16' regions.

The charge storage layer 32 is either a "floating gate" of conductive material, typically of doped polycrystalline silicon, or a dielectric material capable of trapping charge carriers or charge polarization such as silicon nitride, silicon oxynitride, silicon-rich silicon dioxide, or a ferroelectric material. Bottom dielectric layer 33 is typically a thermally grown layer of silicon dioxide, but can be formed using any suitable materials that exhibit dielectric properties. Optional top dielectric layer 31 is typically a grown or deposited layer of silicon dioxide, however, it could be constructed by providing multiple layers of dielectric material, such as a three layer stack of silicon dioxide, silicon nitride and silicon dioxide.

Optionally, transistor 10'" could include a refractory silicide layer on top of the N-type gate 12'". Further, transistor 10'" could optionally be constructed in an N-well formed in the bulk 11' or in an N-well nested inside a P-well, both formed in bulk 11'. In these cases, the bulk doping could be either N-type or P-type.

Figure 9:
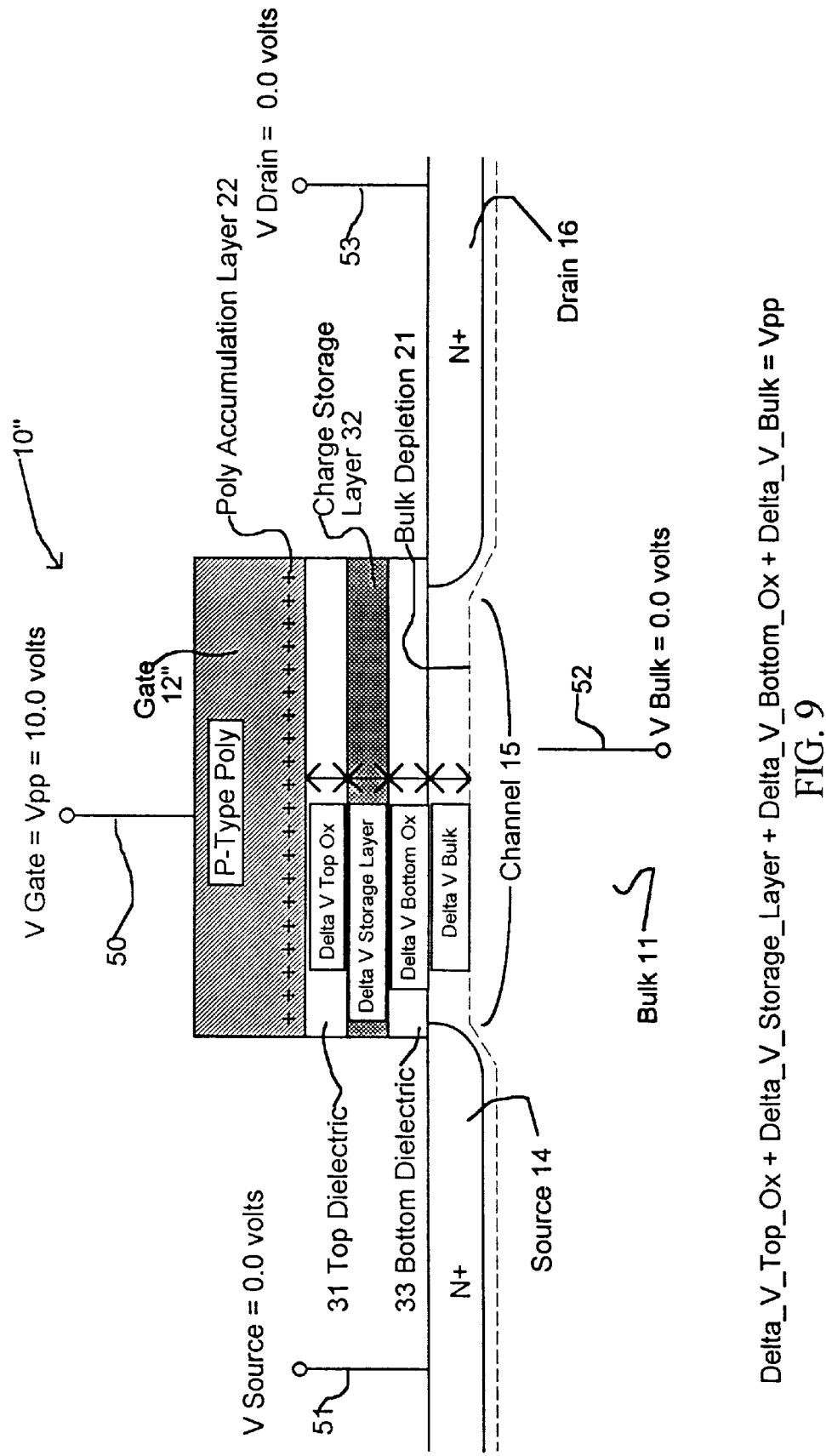
FIG. 9 shows a cross sectional view of an N-channel non-volatile memory transistor according a preferred embodiment of the invention that utilizes a P-type polycrystalline silicon gate under program bias conditions.

As shown in FIG. 9, a positive bias is applied to the poly gate 12" relative to the channel 15 to program transistor 10". In this example, ten volts is applied to gate 12" by way of electrode 50 while the source 14, drain 16 and bulk 11 are held at ground by way of electrodes 51, 53 and 52, respectively. Other bias conditions, such as different voltages or non-grounded bulk 11, source 14 and drain 16 nodes, could be established for programming. The example in FIG. 9 more specifically shows that a voltage differential is created by applying a voltage to the gate 12" which is different from the voltage at the channel surface. The voltage difference between the gate 12" and the bulk 11 creates an electric field that passes through layers 31, 32 and 33 and creates a accumulation layer 22 of free holes in the gate poly and a depletion layer 21 to form the channel 15 in the bulk 11. The applied gate-to-bulk voltage creates accumulation layer 22 because the electric field created by the gate-to-bulk bias attracts the free holes in the P-type poly gate 12" to the interface between the gate 12" and the top of the gate dielectric. Likewise, the electric field created by the gate-to-bulk bias repels the free holes in bulk 11 from interface between the P-type bulk 11 and the bottom dielectric 33.

Since the voltage in the gate is dropped over an accumulation layer rather than a depletion layer, the voltage lost in the poly is much less for a given level of doping compared to prior art devices. This feature allows the poly to be doped to as low as $10^{11}/cm^3$, or less, while achieving the same or better results as when the poly was doped at $\geq 10^{20} cm^3$ in prior art devices. The voltage difference between the gate electrode 50 and the bulk electrode 52 is called Vpp. Vpp is nearly equal to the sum of the voltages dropped across 31, 32, 33, and 21 since the voltage drop in accumulation layer 22 is typically negligible; namely $$Vpp \approx Delta\_V\_Top\_Ox + Delta\_V\_Storage\_Layer + Delta\_V\_Bottom\_Ox + Delta\_V\_Bulk.$$

Figure 10:
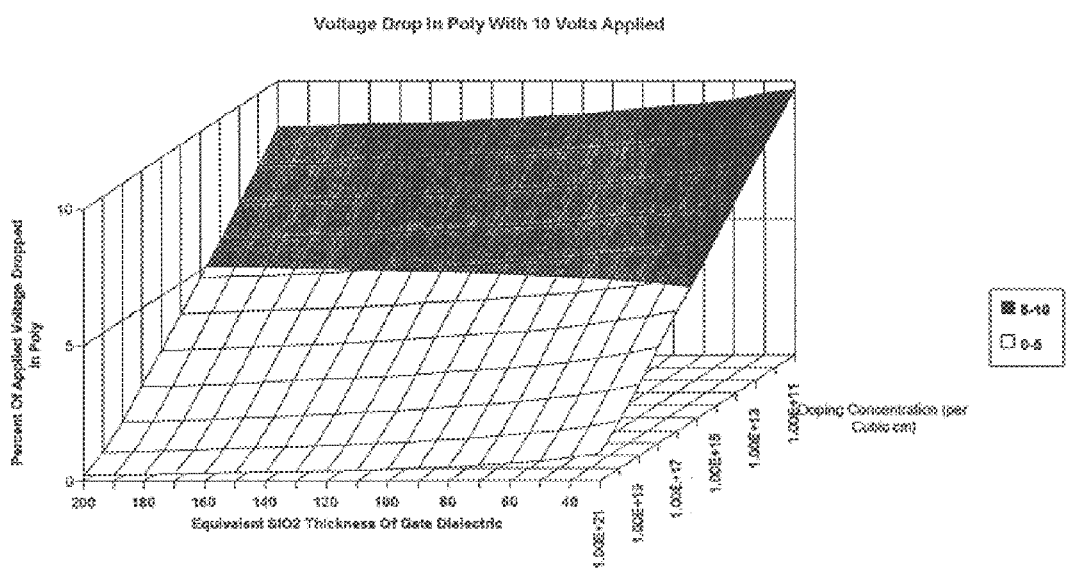
FIG. 10 shows the calculated percent voltage drop in the poly gate according to a preferred embodiment of the invention during a program operation as a function of the doping concentration in the poly and the $SiO_2$ equivalent thickness of the gate dielectric.

The voltage lost in the poly accumulation layer during a program operation for the current invention has been calculated as shown in FIG. 10 for an applied voltage of 10 volts. In this plot, the percent of the applied voltage dropped in the poly is indicated on the vertical axis. The horizontal axis on the right hand side marks the doping concentration in the poly. The horizontal axis on the left hand side indicates the thickness of the gate dielectric in values equivalent to a thickness of $SiO_2$. The shaded bands in the contour indicate domains where the percentage of applied voltage dropped in the poly lies within a 5% range. Two bands show specifically 0 to 5% and 5% to 10% applied voltage drop in the poly.

Figure 1:
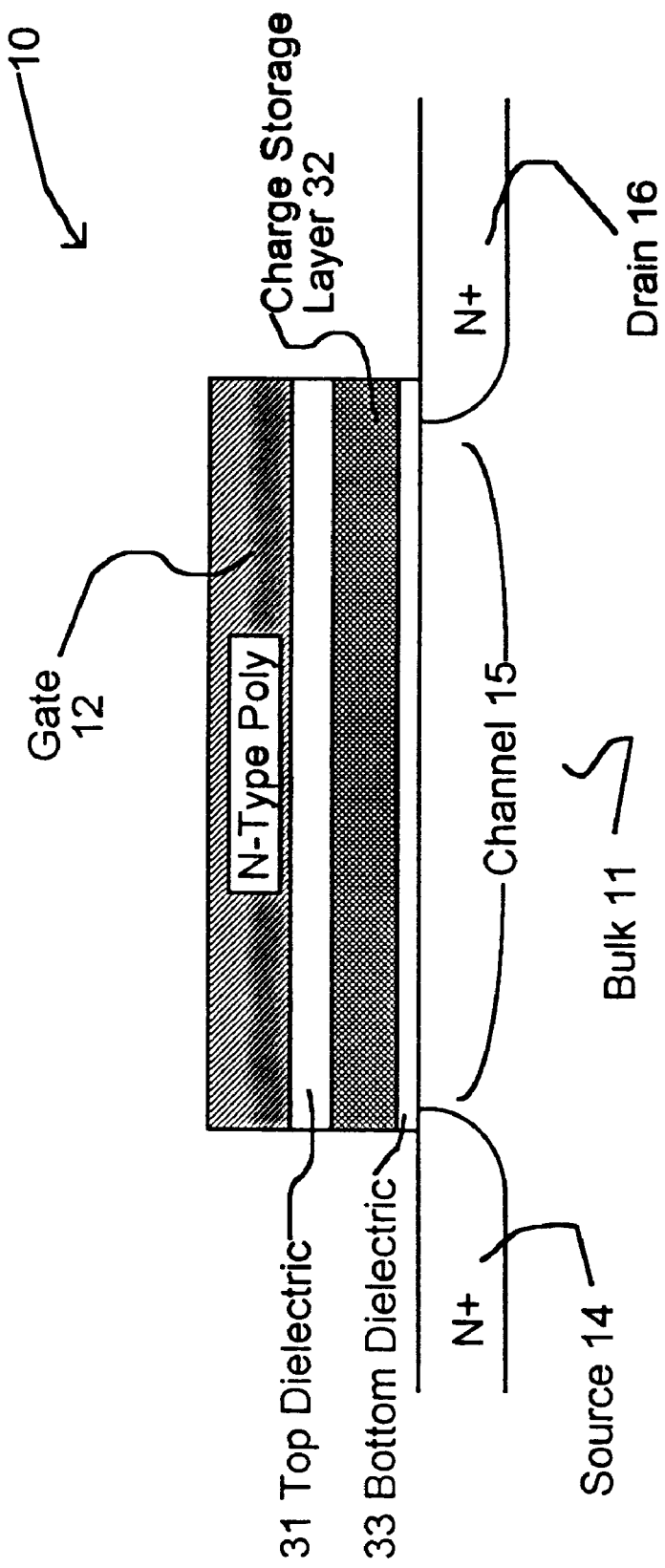
FIG. 1 shows a cross sectional view of an N-channel non-volatile memory transistor according to prior art that utilizes an N-type polycrystalline silicon gate.
Figure 2:
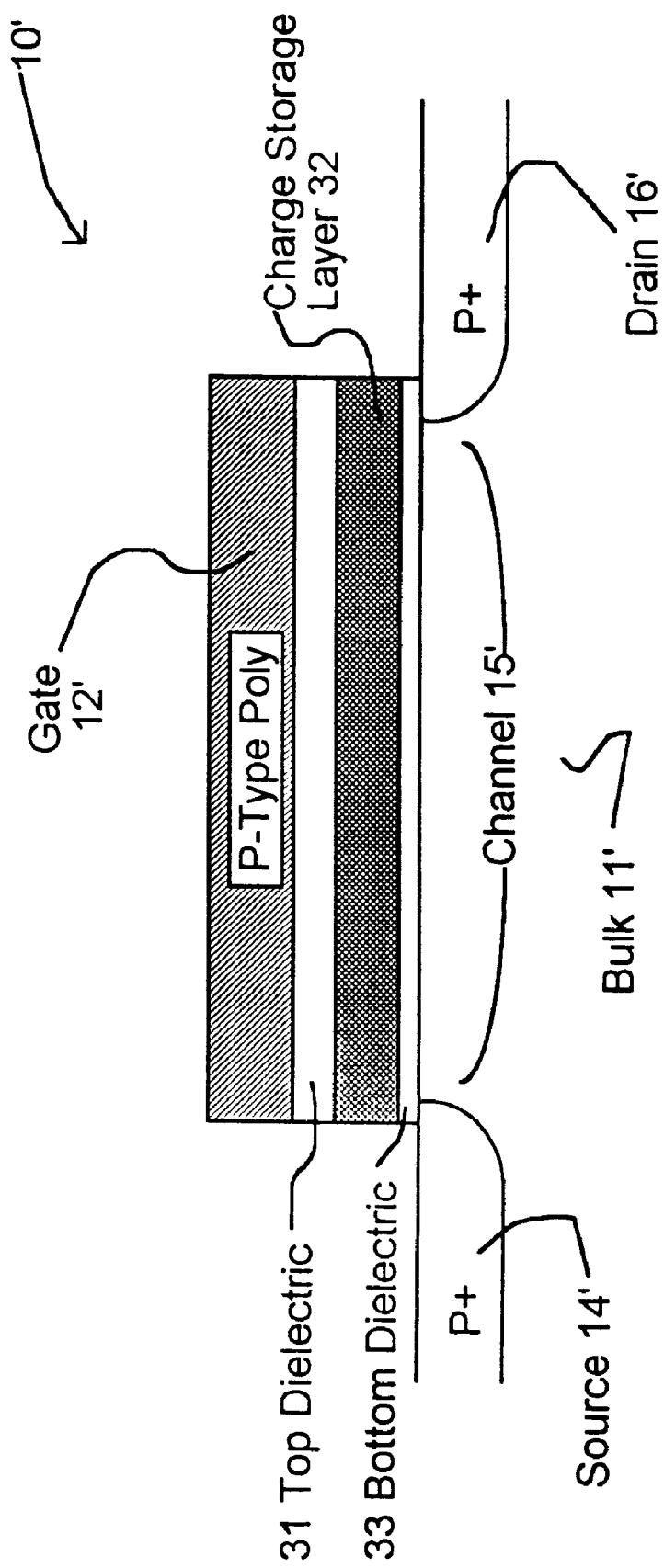
FIG. 2 shows a cross sectional view of a P-channel non-volatile memory transistor according to prior art that utilizes a P-type polycrystalline silicon gate.
Figure 3:
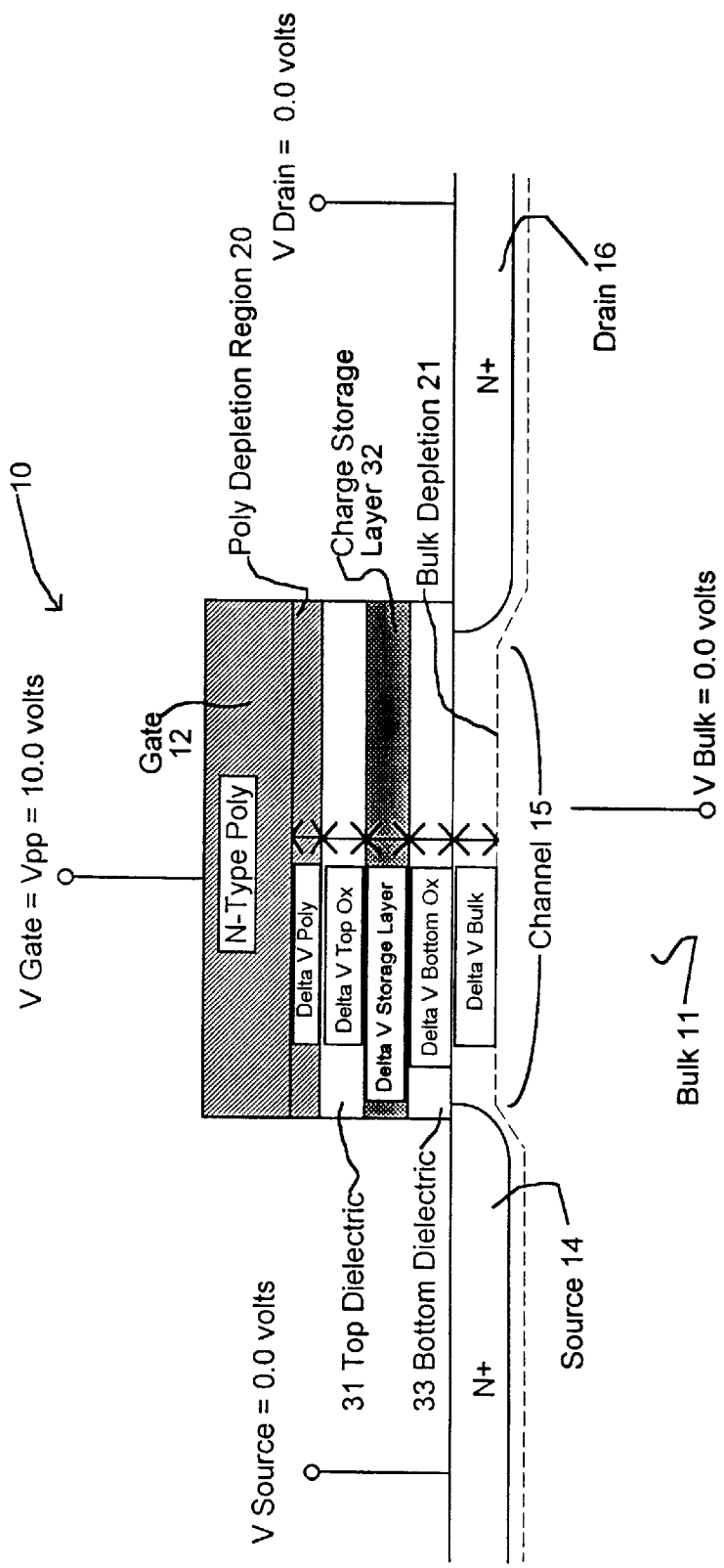
FIG. 3 shows a cross sectional view of an N-channel non-volatile memory transistor under program bias conditions according to prior art that utilizes an N-type polycrystalline silicon gate that is heavily doped to produce a small voltage drop in the gate.
Figure 4:
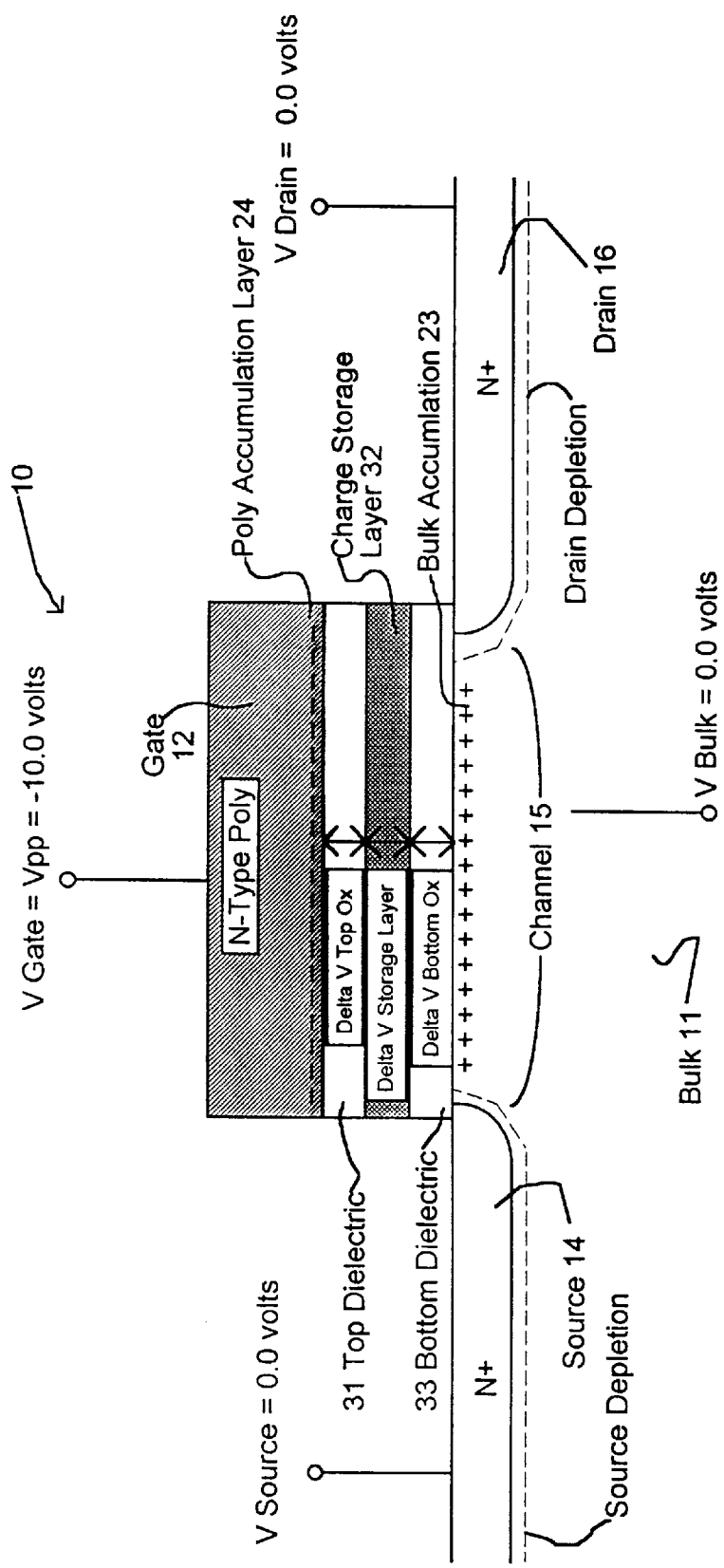
FIG. 4 shows a cross sectional view of an N-channel non-volatile memory transistor under erase bias conditions according to prior art.
Figure 5:
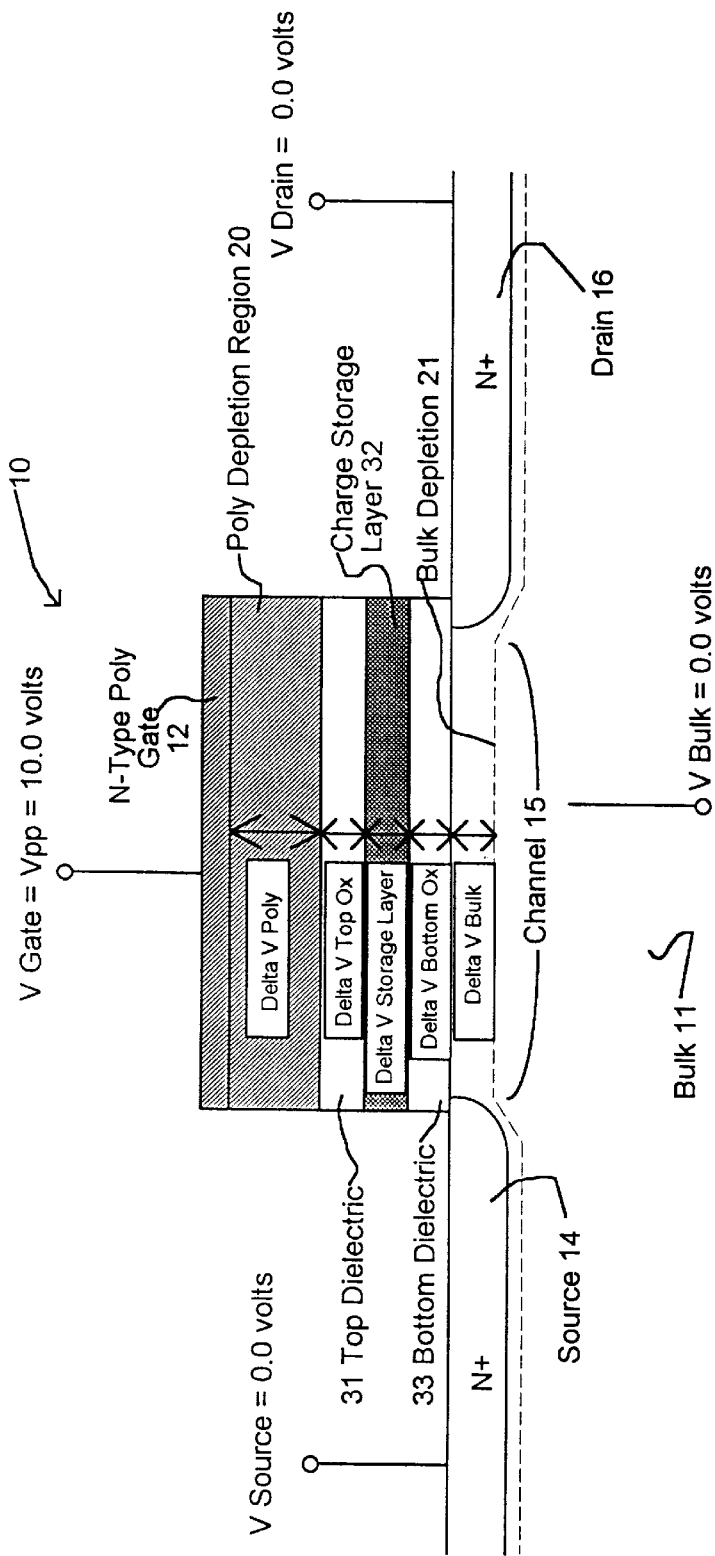
FIG. 5 shows a cross sectional view of an N-channel non-volatile memory transistor according to prior art that utilizes a moderately or lightly doped N-type polycrystalline silicon gate, resulting in a large voltage drop in the gate.
Figure 6:
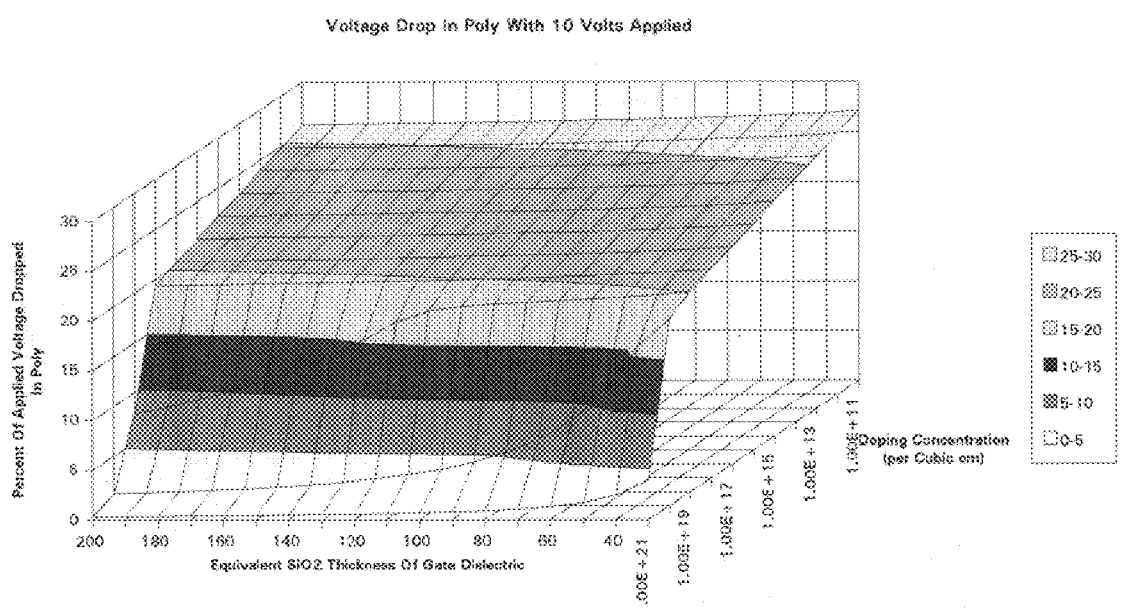
FIG. 6 shows the calculated percent voltage drop in the poly gate according to prior art during a program operation as a function of the doping concentration in the poly and the $SiO_2$ equivalent thickness of the gate dielectric.

As shown in FIG. 6, the percentage of applied voltage that is dropped in the poly is less than 10% for thicknesses over all equivalent gate dielectric thicknesses and poly doping concentrations considered. These particular calculations assume a temperature of 150° C. For lower temperatures, doping levels as low as $10^{10}/cm^3$ would produce less than 10% voltage drop in the poly. Thus, manufacturers building devices according to the current invention can choose from a wide range of possible thicknesses and doping levels without significantly affecting program speeds.

In this embodiment, there is negligible voltage drop in the poly as long as the doping level in the poly is approximately $\geq 10^{11}/cm^3$. The poly doping in this device can be set to a value that optimizes conditions unrelated to the program speed since a depletion layer does not form at the interface between the poly and the top of the gate dielectric under program bias conditions. The applied program voltage efficiently drops across layers 31, 32, 33 and deletion layer 21. Since the tunnel current is an exponential function of the electric field across the dielectric, the write speed can be significantly improved by eliminating the poly depletion voltage loss as shown in this embodiment.

Figure 11:
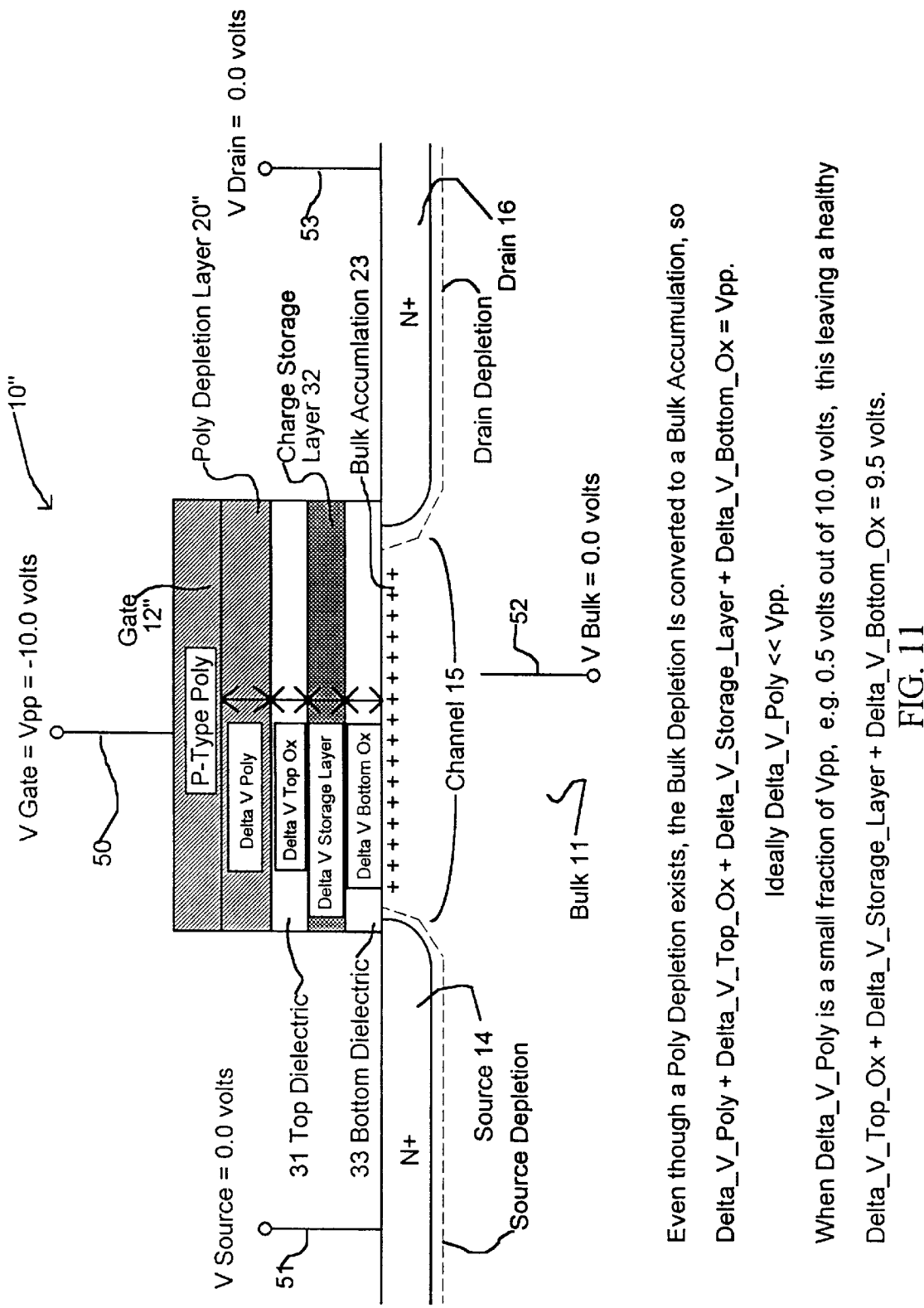
FIG. 11 shows a cross sectional view of an N-channel non-volatile memory transistor according a preferred embodiment of the invention that utilizes a P-type polycrystalline silicon gate under erase bias conditions.

When transistor 10" is being erased as shown in FIG. 11 a negative bias is applied to the P-type poly gate 12" relative to the channel 15 of the N-channel transistor 10", the electric field serves to form a depletion layer 20" at the interface between the poly gate 12" and the top dielectric 31. In this example, negative ten volts is applied to gate 12" by way of electrode 50 while the source 14, drain 16 and bulk 11 are held at ground by way of electrodes 51, 53 and 52, respectively. Other bias conditions, such as different voltages or non-grounded bulk 11, source 14 and drain 16 nodes, could be established for erasing.

The example in FIG. 11 more specifically shows that a voltage differential is created by applying a voltage to the gate 12" which is different from the voltage at the channel surface. In this case, there can be an appreciable voltage lost in the poly depletion layer 20" and the erase speed can be degraded by this lost voltage. However, as stated before, the erase speed is far less critical to system designs than the program speed, and as shown in FIG. 6, the maximum voltage drop in the poly is limited to $\leq 25\%$ due to the inversion layer that forms in lightly doped poly. Further, independent of the gate structure, the erase bias serves to accumulate holes in the channel at the interface between the bulk 11 and the bottom dielectric 33, forming free hole accumulation 23. As a result, negligible voltage is dropped in the bulk 11, so the erase condition results in the Vpp being dropped over layers 31, 32, 33 and depletion layer 20"; namely $$Vpp \approx Delta\_V\_Poly + Delta\_V\_Top\_Ox + Delta\_V\_Storage\_Layer + Delta\_V\_Bottom\_{Ox}.$$

Ideally, the voltage dropped in the poly depletion 20" in this embodiment is small compared to Vpp. This will maximize the voltage dropped over layers 31, 32 and 33. However, this condition is far less critical compared to prior art devices where the voltage dropped in the poly depletion affected the program speed. Since the erase speed can often be compromised without significantly affecting system level performance, it is preferable to accept any speed penalty in the erase speed, rather than the program speed. Further, unlike the program conditions of prior art devices, there is negligible voltage lost in the bulk 11 during an erase since no depletion forms in the bulk during an erase. Thus, a write speed reduction caused by the voltage drop in the poly depletion 20" is not further compounded by a voltage drop in the bulk as occurs in prior art devices under programming conditions.

This is a considerable improvement over prior art where depletion layers formed in both the poly and the bulk during a program operation. In this embodiment, both the program and the erase bias conditions create only one depletion layer and so the program and erase conditions and performance are more symmetric. Further, although the program condition includes a detrimental depletion layer, the depletion can be minimized by the use of channel doping techniques, such as either a buried channel or a depletion channel.

Figure 12:
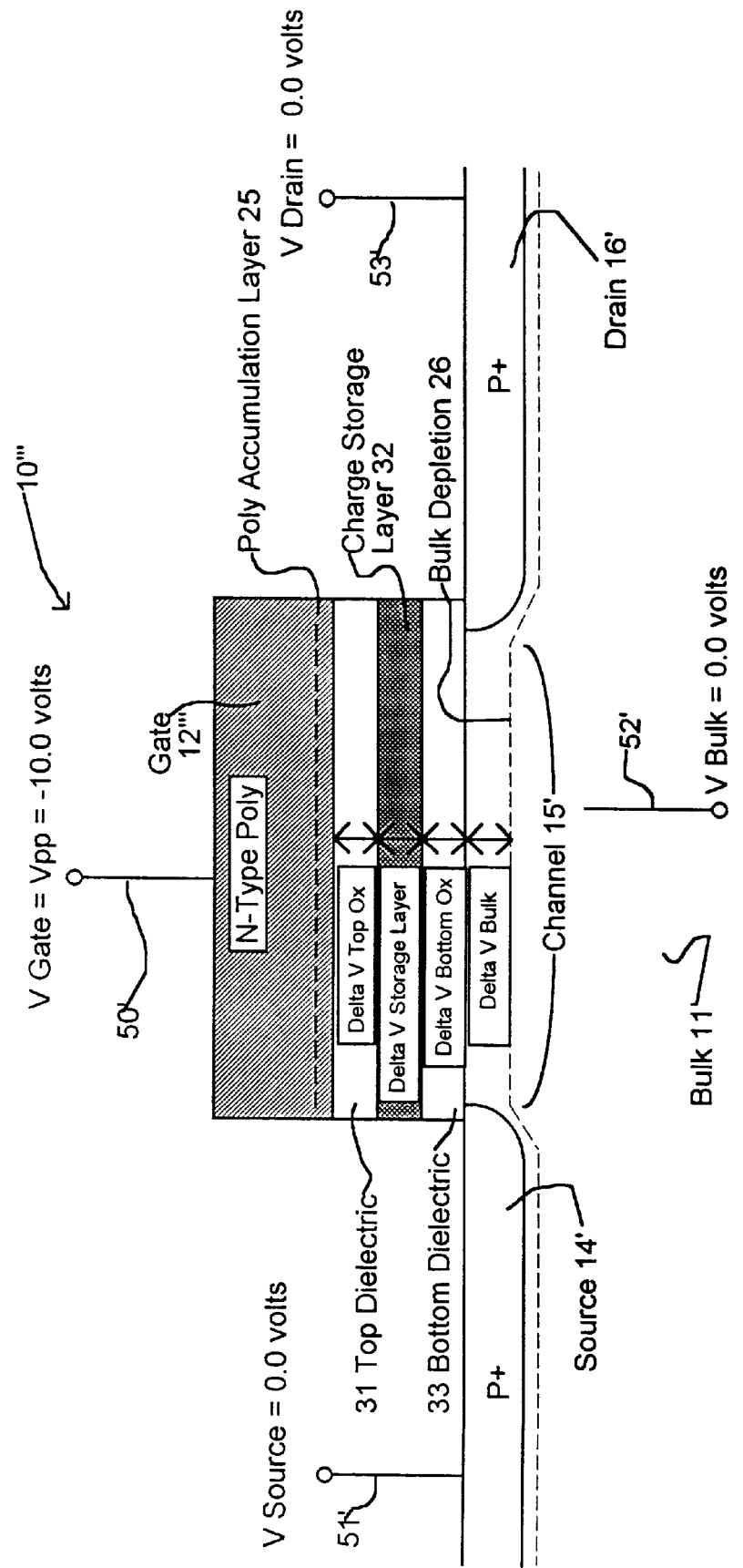
FIG. 12 shows a cross sectional view of a P-channel non-volatile memory transistor according a preferred embodiment of the invention that utilizes an N-type polycrystalline silicon gate under program bias conditions.

Similar benefits result in the embodiment disclosed in FIG. 8 for a P-channel non-volatile memory transistor. As shown in FIG. 12, a negative bias is applied to the poly gate 12'" relative to the channel 15' to program transistor 10'". In this example, negative ten volts is applied to gate 12'" by way of electrode 50' while the source 14', drain 16' and bulk 11' are held at ground by way of electrodes 51', 53' and 52', respectively. Other bias conditions, such as different voltages or non-grounded bulk 11', source 14' and drain 16' nodes, could be established for programming. The example in FIG. 12 more specifically shows that a voltage differential is created by applying a voltage to the gate 12''' which is different from the voltage at the channel surface. The voltage difference between the gate 12''' and the bulk 11' creates an electric field that passes through layers 31, 32 and 33 and creates an accumulation layer 25 of free electrons in the gate poly 12''' and a depletion layer 26 to form the channel 15' in the bulk 11'. The applied gate-to-bulk voltage creates accumulation layer 25 because the electric field created by the gate-to-bulk bias attracts the free electrons in the N-type poly gate 12''' to the interface between the gate 12''' and the top of the gate dielectric. Likewise, the electric field created by the gate-to-bulk bias repels the free electrons in bulk 11' from interface between the N-type bulk 11' and the bottom dielectric 33.

Since the voltage in the gate is dropped over an accumulation layer rather than a depletion layer, the voltage lost in the poly is much less for a given level of doping compared to prior art devices. This feature allows the poly to be doped to as low as $10^{11}/cm^3$, or less, while achieving the same or better results as when the poly was doped at $\geq 10^{20}/cm^3$ in prior art devices. The voltage difference between the gate electrode 50' and the bulk electrode 52' is called Vpp. Vpp is nearly equal to the sum of the voltages dropped across 31, 32, 33, and 26; namely $$Vpp \approx Delta\_V\_Top\_Ox + Delta\_V\_Storage\_Layer + Delta\_V\_Bottom\_Ox + Delta\_V\_Bulk.$$

In this embodiment, there is negligible voltage drop in the poly gate 12''', as long as the doping level in the poly is approximately $\geq 10^{11}/cm^3$. The poly doping in this device can be set to a value that optimizes conditions unrelated to the program speed since a depletion layer does not form at the interface between the poly and the top of the gate dielectric under program bias conditions. The applied program voltage efficiently drops across layers 31, 32, 33 and depletion layer 26. Since the tunnel current is an exponential function of the electric field across the dielectric, the write speed can be significantly improved by eliminating the poly depletion voltage loss as shown in this embodiment.

Figure 13:
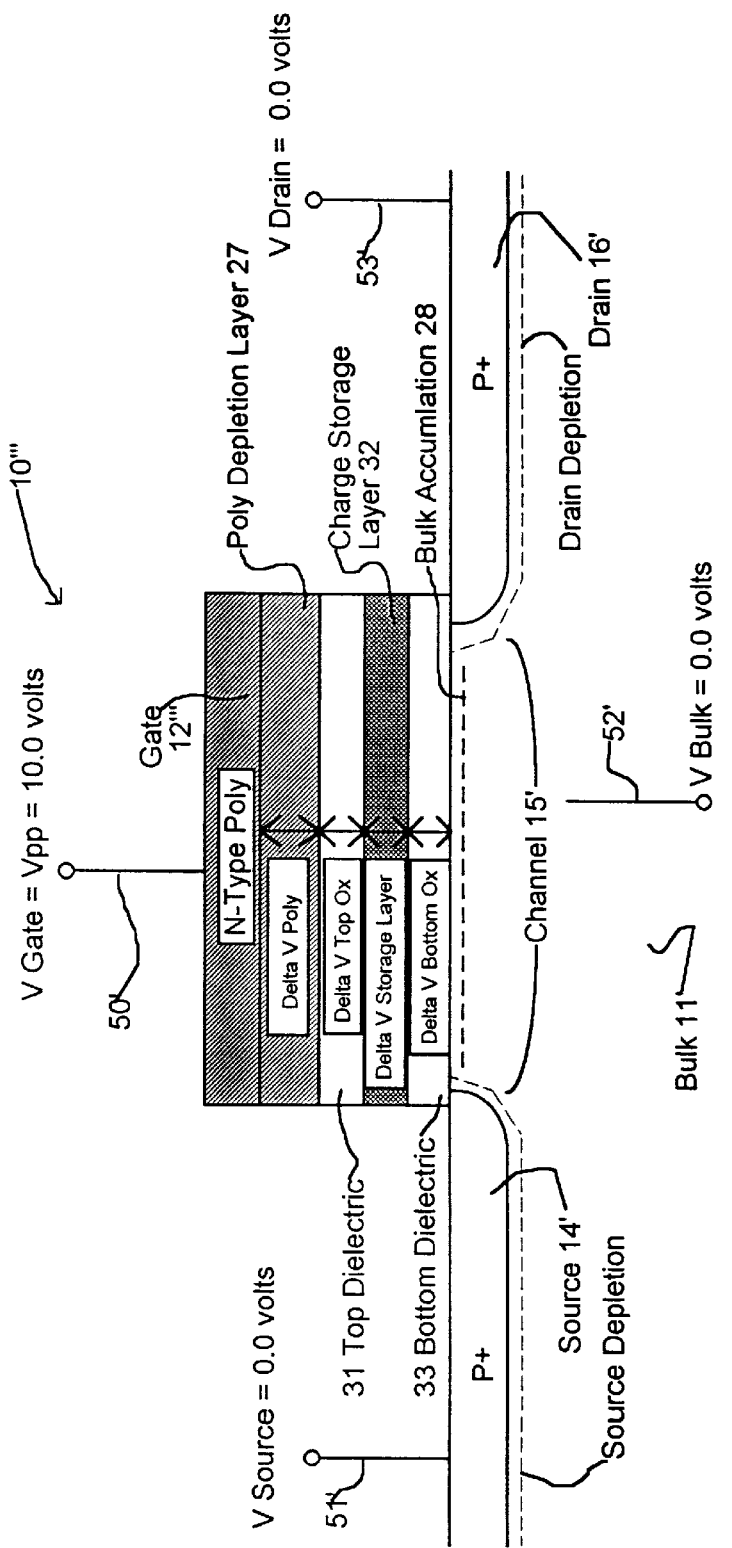
FIG. 13 shows a cross sectional view of a P-channel non-volatile memory transistor according a preferred embodiment of the invention that utilizes an N-type polycrystalline silicon gate under erase bias conditions.

When transistor 10''' is being erased as shown in FIG. 13 a positive bias is applied to the N-type poly gate 12''' relative to the channel 15' of the P-channel transistor 10''', the electric field serves to form a depletion layer 27 at the interface between the poly gate 12''' and the top of the gate dielectric. In this example, positive ten volts is applied to gate 12''' by way of electrode 50' while the source 14', drain 16' and bulk 11' are held at ground by way of electrodes 51', 53' and 52', respectively. Other bias conditions, such as different voltages or non-grounded bulk 11', source 14' and drain 16' nodes, could be established for erasing. The example in FIG. 13 more specifically shows that a voltage differential is created by applying a voltage to the gate 12''' which is different from the voltage at the channel surface. In this case, there is voltage lost in the poly depletion layer 27 and the erase speed can be degraded by this lost voltage. However, as stated before the erase speed is far less critical to system designs than the program speed. Further, independent of the gate structure, the erase bias serves to accumulate electrons in the channel at the interface between the bulk 11' and the bottom dielectric 33, forming free electron accumulation 28. As a result, negligible voltage is dropped in the bulk and so the erase condition results in the Vpp being dropped primarily over layers 31, 32, 33 and depletion layer 27; namely $$Vpp \approx Delta\_V\_Poly + Delta\_V\_Top\_Ox + Delta\_V\_Storage\_Layer + Delta\_V\_Bottom\_Ox.$$

Again, this result is a considerable improvement over prior art where depletion layers formed in both the poly and the bulk during a program operation. In this embodiment, both the program and the erase bias conditions create only one depletion layer and so the program and erase conditions and performance are more symmetric. Further, although the program condition includes a detrimental depletion layer, the depletion can be minimized by the use of channel doping techniques, such as either a buried channel or a depletion channel.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A non-volatile semiconductor device comprising:
   a semiconductor substrate;
   source and drain regions in said substrate separated by a channel region;
   a control gate comprising a layer of polycrystalline silicon of conductivity type different from that of said source and drain regions; and
   a multilayer gate dielectric between said control gate and said channel region comprising at least one charge storage layer and being dielectrically equivalent to a layer of silicon dioxide having a thickness of less than 200 angstroms.

2. The device of claim 1 wherein said control gate further comprises a layer of refractory suicide.

3. The device of claim 1 wherein said control gate includes a doping material concentration of less than $10^{16}/cm^3$.

4. The device of claim 3 wherein said doping material is selected from the group consisting of antimony, boron, phosphorous and arsenic.

5. The device of claim 1 wherein said source and drain regions are doped primarily N-type and said gate is doped P-type.

6. The device of claim 1 wherein said source and drain regions are doped primarily P-type and said gate is doped N-type.

7. The device of claim 1 wherein said multilayer gate dielectric further comprises a second dielectric material layer between said charge storage layer and said channel.

8. The device of claim 7 wherein said second dielectric material layer comprises silicon dioxide.

9. The device of claim 7 wherein said multilayer gate dielectric further comprises a third dielectric material layer between said charge storage layer and said control gate.

10. The device of claim 9 wherein said third dielectric material layer comprises silicon dioxide.

11. The device of claim 9 wherein said third dielectric material layer comprises a three layered structure of a layer of silicon dioxide, on a layer of silicon nitride on yet another layer of silicon dioxide.

12. The device of claim 1 wherein said charge storage layer comprises a floating gate.

13. The device of claim 12 wherein said floating gate comprises polycrystalline silicon.

14. The device of claim 1 wherein said charge storage layer comprises a dielectric material capable of trapping charge carriers.

15. The device of claim 1 wherein said charge storage layer comprises a dielectric material capable of trapping charge polarization.

16. The device of claim 1 wherein said charge storage layer comprises a material selected from the group consisting of silicon nitride, silicon oxynitride, silicon-rich silicon dioxide, and ferroelectric materials.

17. The device of claim 1 wherein said substrate has a first conductivity type and said source and drain regions are semiconductor regions of a second conductivity type.

18. The device of claim 1 wherein said substrate has a first conductivity type and said source and drain regions are semiconductor regions of a first conductivity type; and wherein said non-volatile memory device further comprises a first well region of a second conductivity type formed in said substrate as to surround at least said source and drain regions and said channel region.

19. The device of claim 1 wherein said substrate has a first conductivity type and said source and drain regions are semiconductor regions of a second conductivity type; and wherein said non-volatile memory device further comprises a first well region of a first conductivity type formed in said substrate as to surround at least said source and drain regions and said channel region; and wherein said non-volatile memory device further comprises an additional second well region of the second conductivity type formed in said substrate as to surround at least said first well region.

20. The device of claim 1 wherein said channel region comprises a buried channel.

21. The device of claim 1 wherein said channel region comprises a depletion channel.

22. A non-volatile semiconductor device comprising:

a semiconductor substrate;

source and drain regions in said substrate separated by a channel region having a channel length less than about 0.7 microns;

a control gate comprising a layer of polycrystalline silicon of conductivity type different from that of said source and drain regions; and a multilayer gate dielectric between said control gate and said channel region comprising a charge storage layer.

23. The device of claim 22 wherein said control gate further comprises a layer of refractory silicide.

24. The device of claim 22 wherein said control gate includes a doping material concentration of less than $10^{16}/cm^3$.

25. The device of claim 24 wherein said doping material is selected from the group consisting of antimony, boron, phosphorous and arsenic.

26. The device of claim 22 wherein said source and drain regions are doped primarily N-type and said gate is doped P-type.

27. The device of claim 22 wherein said source and drain regions are doped primarily P-type and said gate is doped N-type.

28. The device of claim 22 wherein said multilayer gate dielectric further comprises a second dielectric material layer between said charge storage layer and said channel.

29. The device of claim 28 wherein said second dielectric material layer comprises silicon dioxide.

30. The device of claim 28 wherein said multilayer gate dielectric further comprises a third dielectric material layer between said charge storage layer and said control gate.

31. The device of claim 30 wherein said third dielectric material layer comprises silicon dioxide.

32. The device of claim 30 wherein said third dielectric material layer comprises a three layered structure of a layer of silicon dioxide, on a layer of silicon nitride on yet another layer of silicon dioxide.

33. The device of claim 22 wherein said charge storage layer comprises a floating gate.

34. The device of claim 33 wherein said floating gate comprises polycrystalline silicon.

35. The device of claim 22 wherein said charge storage layer comprises a dielectric material capable of trapping charge carriers.

36. The device of claim 22 wherein said charge storage layer comprises a dielectric material capable of trapping charge polarization.

37. The device of claim 22 wherein said charge storage layer comprises a material selected from the group consisting of silicon nitride, silicon oxynitride, silicon-rich silicon dioxide, and ferroelectric materials.

38. The device of claim 22 wherein said substrate has a first conductivity type and said source and drain regions are semiconductor regions of a second conductivity type.

39. The device of claim 22 wherein said substrate has a first conductivity type and said source and drain regions are semiconductor regions of a first conductivity type; and wherein said non-volatile memory device further comprises a first well region of a second conductivity type formed in said substrate as to surround at least said source and drain regions and said channel region.

40. The device of claim 22 wherein said substrate has a first conductivity type and said source and drain regions are semiconductor regions of a second conductivity type; and wherein said non-volatile memory device further comprises a first well region of a first conductivity type formed in said substrate as to surround at least said source and drain regions and said channel region; and wherein said non-volatile memory device further comprises an additional second well region of the second conductivity type formed in said substrate as to surround at least said first well region.

41. The device of claim 22 wherein said channel region comprises a buried channel.

42. The device of claim 22 wherein said channel region comprises a depletion channel.

43. A non-volatile semiconductor device having source and drain regions of a first conductivity type in said substrate separated by a channel region of length less than about 0.7 microns, comprising:

a control gate comprising a layer of polycrystalline silicon of second conductivity type different from said first conductivity type; and a multilayer gate dielectric between said control gate and said channel region comprising a charge storage layer.

44. The non-volatile semiconductor device of claim 43 wherein said multilayer gate dielectric is dielectrically equivalent to a layer of silicon dioxide having a thickness of less than 200 angtroms.

45. The device of claim 43 wherein said control gate further comprises a layer of refractory silicide.

46. The device of claim 43 wherein said source and drain regions are doped primarily N-type and said control gate is doped P-type.

47. The device of claim 43 wherein said source and drain regions are doped primarily P-type and said control gate is doped N-type.

48. The device of claim 43 wherein said charge storage layer comprises a floating gate.

* * * * *

UNITED STATES PATENT AND TRADEMARK OFFICE
CERTIFICATE OF CORRECTION

PATENT NO. : 6,141,676
DATED : October 31, 2000
INVENTOR(S) : Jaime Ramirez-Angulo and Mark R. DeYong It is certified that error appears in the above-identified patent and that said Letters Patent are hereby corrected as shown below:

In claim 17, line 2, delete "buy" and insert therefor --by--.
In claim 24, on the last line, delete "he" and insert therefor --the--

Signed and Sealed this

Twenty-second Day of May, 2001

Attest:

NICHOLAS P. GODICI

*Attesting Officer*     *Acting Director of the United States Patent and Trademark Office*